United States Patent [19]

Schroeder

[11] 4,086,580
[45] Apr. 25, 1978

[54] DIGITAL ALTITUDE ENCODER

[76] Inventor: Rondon L. Schroeder, 1717 S. Topeka, Wichita, Kans. 67211

[21] Appl. No.: 641,992

[22] Filed: Dec. 18, 1975

[51] Int. Cl.² .................. G01D 5/34; H03K 13/02
[52] U.S. Cl. .................. 340/347 P; 235/92 MP; 250/231 SE; 73/384; 244/180
[58] Field of Search ............ 340/347 AD; 235/150.2, 235/151.32, 92 MP, 92 PE; 73/384, 387, 418, 386; 244/180, 181, 182; 250/231 SE; 346/33 TP

[56] References Cited

U.S. PATENT DOCUMENTS

| 2,656,106 | 10/1953 | Stabler | 340/347 P |
| 2,750,801 | 6/1956 | Fauvelot | 73/387 |
| 3,271,758 | 9/1966 | Stultz et al. | 340/347 P |
| 3,353,408 | 11/1967 | Daleo | 73/387 |
| 3,513,708 | 5/1970 | Springer | 73/384 |
| 3,662,347 | 5/1972 | Fox | 340/347 DD |
| 3,750,473 | 8/1973 | Bennett et al. | 73/387 |
| 3,839,626 | 10/1974 | Klem et al. | 73/384 X |
| 3,906,223 | 9/1975 | White | 73/387 X |
| 3,918,307 | 11/1975 | Hulle et al. | 73/387 |
| 3,940,990 | 3/1976 | Younkin | 73/387 |

Primary Examiner—Thomas J. Sloyan

[57] ABSTRACT

In one exemplar embodiment, a digital altitude encoder is provided that utilizes a conventional altimeter responsive to atmospheric pressure for rotationally driving an indicator shaft. Attached to the shaft is a disc having repetitive, alternate, regularly disposed solid portions and slots. A light source and a pair of light detectors for receiving light from the source are spaced adjacent the disc to permit one of the detectors to generate a first signal and the other detector to generate a second signal having a relative time of occurrence dependent on the direction of the rotation of the disc. A counting means that is presettable to a predetermined digital count representative of a preselected altitude function receives the first and second signals and increments or decrements the predetermined count in response to changes in altitude. A code conversion circuit receives the digital signal output from the counter and converts the digital signal to a parallel digital code acceptable for transmission of aeronautical altitude information.

13 Claims, 11 Drawing Figures

ALTITUDE

DIGITAL ALTITUDE ENCODER

BACKGROUND OF THE INVENTION

This invention relates to altimeters for aircraft, and more particularly to a digital encoding altimeter for measuring changes in altitude of an aircraft and converting such altitude changes to digital signals which are in turn converted to a parallel digital code acceptable for transmission of aeronautical altitude information, such as the ICAO international code.

In the prior art, altitude encoders have been of the absolute or direct reading type. Absolute encoders provide a binary output signal of several bits which is representative of shaft position any time the encoder is turned on. This output is different for different angular positions of the shaft. As an example, an encoding altimeter of the absolute type has eight to 10 code tracks and eight to ten optical sensors to read these tracks. These encoders must be able to resolve 150 – 600 different angular positions in one revolution, and because the code discs are only about 5 centimeters in diameter, it is apparent that errors of greater than a few tenths of a millimeter in either sensor alignment or track registration will cause errors in the output. Moreover, the clearances between the encoder disc and sensors must be on the order of a few tenths of a millimeter, and this close fit makes it possible that shock or vibration, always prevalent in aircraft, will cause some misalignment which will result in erroneous output signals. A much more serious consequence of misalignment occurs if the disc, which is driven by the altimeter mechanism, comes into contact with the nearby sensors. This frictional drag can easily cause greater torque than the mechanism can overcome. The result is a "stuck" altimeter. If, as is usually the case, the pilot is also using this altimeter for an altitude reference, an extremely dangerous situation is created. Such encoding altimeters of the absolute or direct reading type are shown in U.S. Pat. Nos. 3,750,473 and 3,808,431. Other altitude encoding devices are shown in U.S. Pat. Nos. 3,546,470, 3,513,708 and 3,750,474.

Accordingly, one primary feature of the present invention is to provide an incremental altitude encoder which provides the same or repetitive output signal each time the altimeter indicating shaft is moved through a predetermined angle.

Another feature of the present invention is to provide a digital altimeter encoder which includes a counter which is presettable to a predetermined digital count representative of a preselected, altitude function, and to which the incremental signal provided by the rotation of the shaft is added or subtracted to provide an output which is representative of altitude.

Yet another feature of the present invention is to provide a digital altitude encoder which is inherently more accurate, simpler in construction, and less critical in the design of the mechanical parts of the rotating disc and spaced sensors.

Still another feature of the present invention is to provide a digital altitude encoder which utilizes a single track code disc which makes only a predetermined number of transitions per revolution of the shaft, and hence can tolerate errors in alignment of several millimeters, and further provides for clearance between the sensor and disc of several millimeters.

SUMMARY OF THE INVENTION

The present invention remedies the problems of the prior art by providing a digital altitude encoder that utilizes a disc driven by the altitude indicator shaft of the altimeter that makes only ten, or another predetermined number of transitions per revolution, and generates electrical signals that have a relative time of occurrence depending on the direction of rotation of the shaft. These signals are used, in turn, to generate signals representative of an increase in altitude and a decrease in altitude responsive to the relative time of occurrence of the first two signals, and are applied to a counter. The counter is preset to a predetermined digital count representative of a preselected pressure altitude by means of presettable switches. The counter receives the signals representative of an increase or decrease in altitude and increments or decrements the preset count in the counter in response to changes in altitude, the output of the counter comprising a digital signal representative of altitude.

The digital signal from the counter is supplied to a code conversion circuit that converts the digital signals to a parallel digital code acceptable for transmission of aeronautical altitude information (the international ICAO code) and then to a transponder for generating and transmitting a radio frequency signal representative of the altitude. Of course, a read only memory (ROM) may be utilized in place of the hard wired ICAO code converter circuit and programmed to accomplish the ICAO code conversion. In other embodiments, the counter may be replaced with a mini- or microcomputer or -processor which will accomplish the counting and code conversion functions.

The disc is mounted on the indicator shaft of the altimeter and rotatable therewith and has repetitive, alternate, radially disposed opaque and transparent portions (solid protions and radially disposed slots), the disc being disposed between a spaced light source and a pair of light detectors for causing the repetitive opaque portions of the disc to mask one of the detectors before masking the other detector, thereby generating the first and second signals having a relative time of occurrence depending on the direction of rotation of the altimeter indicating shaft.

In another embodiment, the disc mounted on the altimeter indicator shaft and rotatable therewith may have repetitive, alternate, radially disposed light absorbing and reflecting portions, a light source and a pair of light detectors being spaced from the disc and located on the same side of the disc for causing the repetitive reflective portions of the disc to reflect light to one of the detectors before reflecting light to the other detector for generating the first and second signals having a relative time of occurrence dependent on the direction of rotation of the shaft.

BRIEF DESCRIPTION OF THE DRAWINGS

In order that the manner in which the above-recited advantages and features of the invention are attained can be understood in detail, a more particular description of the invention may be had by reference to specific embodiments thereof which are illustrated in the appended drawings, which drawings form a part of this specification. It is to be noted, however, that the appended drawings illustrate only typical embodiments of the invention and therefore are not to be considered limiting of its scope for the invention may admit to further equally effective embodiments.

In the Drawings.

DETAILED DESCRIPTION OF THE PREFERRED EMBODIMENTS

Figure 1:
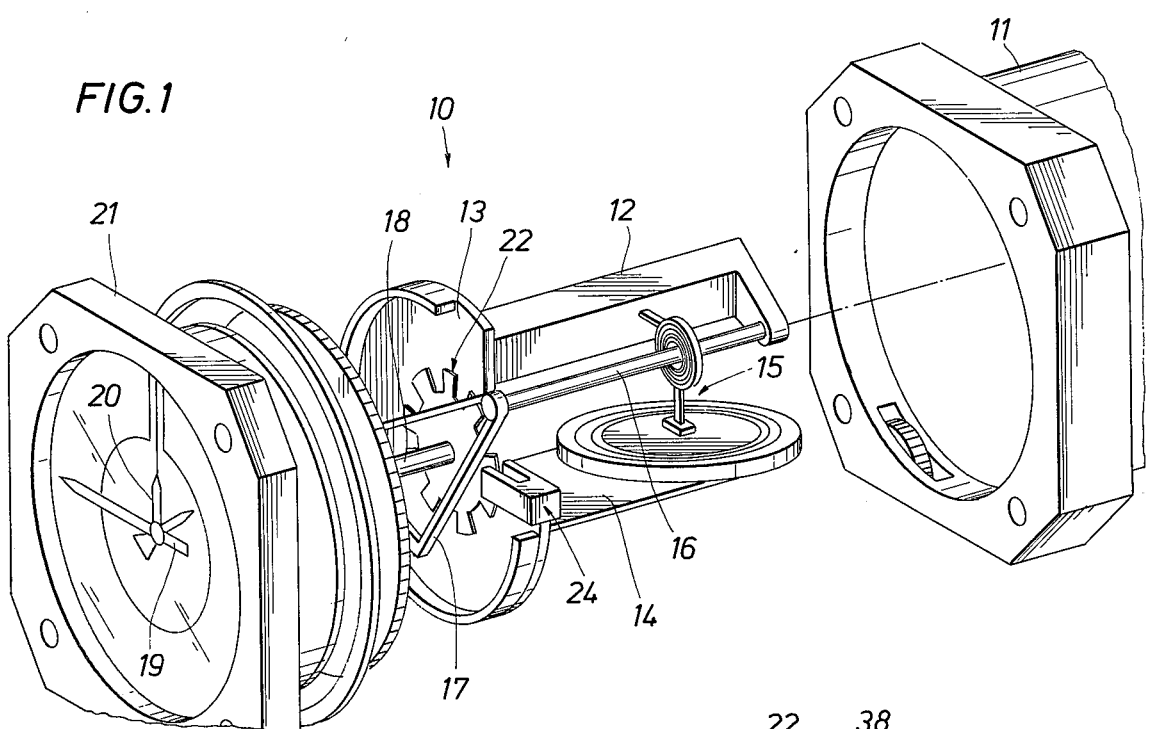
FIG. 1 is a partial perspective view of a conventional altimeter showing the mechanical arrangement of the signal generating means of the present invention.

Referring now to FIG. 1, a portion of the mechanical apparatus of a conventional pneumatic altimeter is shown, with a portion of the altitude encoding assembly 10 shown in its mechanical relationship to the basic altimeter. The altimeter case 11 houses a frame assembly 12 to which is attached a vertical support plate 13 and a horizontally disposed bracket 14. An aneroid barometer assembly 15 drives a shaft 16 and attached sector gear 17 which in turn drives an indicating shaft 18 by means of a gearing arrangement (not shown). The rotation of the shaft 18 drives attached indicating hands 19 and 20 on the altimeter face 21 for indicating altitude as a function of the atmospheric pressure. Attached to indicator shaft 18 is an interrupting means for disc 22 which rotates with shaft 18 and cooperates with signal generating means 24 for producing a plurality of signals representative of the change in altitude as a function of the rotation of shaft 18, as will be hereinafter more particularly described.

Figure 3:
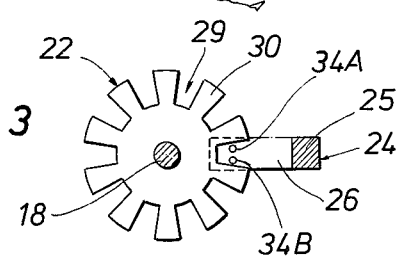
FIG. 3 is a partial vertical cross-sectional view of the signal generating means of FIG. 2 as taken along lines 3—3 of FIG. 2.
Figure 2:
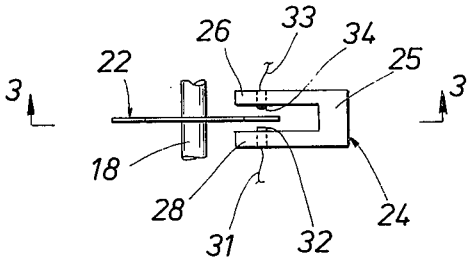
FIG. 2 is a partial plan view of one embodiment of the signal generating means for generating the first and second signals according to the present invention.

Referring now to FIGS. 1, 2 and 3, one embodiment of the interrupting means cooperating with one embodiment of the signal generating means is shown in greater detail. The disc 22 is mounted on shaft 18 for rotation therewith, and the signal generating means 24 is comprised of a U-shaped frame 25 having extending arms 26 and 28, with space therebetween. The arms 26 and 28 extend over and cover a portion of disc 22 in order that the disc can rotate freely between the spaced arms. Arm 28 carries at least one light source 32 that is connected to a suitable source of electrical power (not shown) by means of conductor 31. Arm 26 carries a pair of light detector elements 34 that are interconnected to the altitude encoder circuitry by means of a plurality of conductors 33.

Figure 7:
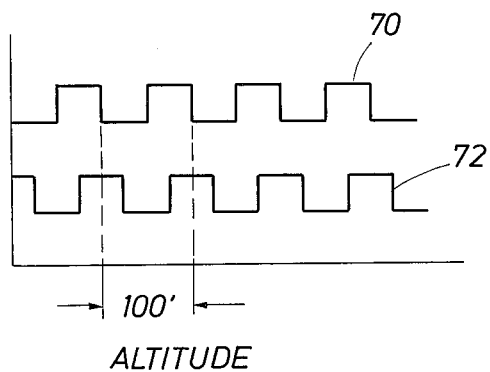
FIG. 7 is a pictorial view of the first and second signals generated by the signal generating means according to the present invention.

As shown in FIG. 3, the disc 22 has spaced about its periphery a series of repetitive, alternate, radially disposed opaque portions 30 and slots 29. As the disc 22 rotates in one direction, the opaque portions 30 and slots 29 will alternately pass in front of detectors 34A and 34B for generating first and second signals, by detectors 34A and 34B, respectively, that vary as the opaque or slotted portions, 30 and 29, respectively, pass between the detectors 34A and 34B, and the light source 32. The signal outputs of detectors 34A and 34B are shown pictorially in FIG. 7, as signals 70 and 72. It will be noted that when the disc 22 is turning in a clockwise direction, signal 70, the output of detector 34A, will lead signal 72, the output of detector 34B by approximately 90°. However, if the disc 22 is rotating in a counter-clockwise direction, then the output of detectors 34A and 34B would be reversed, and the signal from detector 34B would lead the signal from detector 34A. The reason for this difference in phase between the detector outputs of detector 34A and 34B, is that with the detectors 34A and 34B spaced in the direction of rotation of the disc, the opaque portion 30 of disc 22 will mask first one and then the other of the two detectors, depending on the direction in which the disc 22 rotates, thereby creating the phase difference between the two signals, as shown in FIG. 7. One cycle of signals 70 or 72 will equal a 100-foot change in altitude as also shown in FIG. 7.

Figure 5:
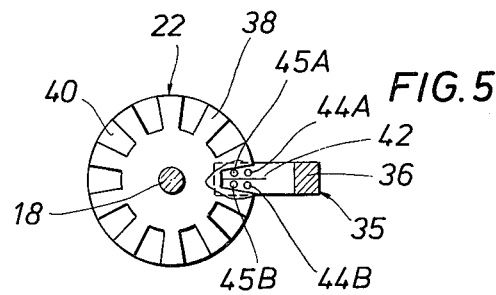
FIG. 5 is a partial vertical cross-sectional view of the signal generating means of FIG. 4 as taken along lines 5—5 of FIG. 4.
Figure 4:
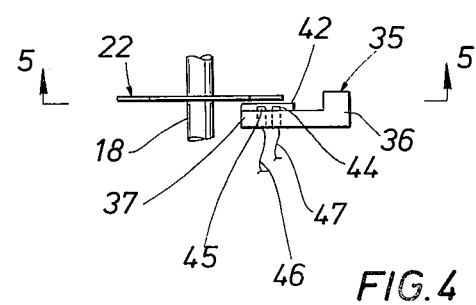
FIG. 4 is a partial plan view of a second embodiment of the signal generating means for generating the first and second signals according to the present invention.

Referring now to FIGS. 1, 4 and 5, a second embodiment of the interrupting means or disc 22 and the signal generating means 35 is shown. The disc 22 is mounted on shaft 18 for rotation therewith, and the signal generating means comprises a frame 36 having extending arm 37 that is spaced from and parallel to the surface of disc 22. Mounted on arm 37 are a pair of spaced light sources 44A and 44B and a pair of spaced detectors 45A and 45B with an extending rib 42 between adjacent light source detector pairs 44A, and 45A and 44B and 45B. Disc 22 has disposed about its periphery repetitive, alternate, radially disposed portions that are light absorbing portions 38, or light reflecting portions 40. As the disc rotates light from the light sources 44A and 44B is alternately absorbed by light absorbent portions 38, or reflected by light reflective portions 40 to the associated detector, 45A or 45B. Rib 42 ensures that the light from source 44A will be reflected only to detector 45A, and that the light from source 44B will be reflected only to the detector 45B. The signals generated by detectors 45A and 45B will be identical to the first and second signals generated by detectors 34A and 34B as hereinbefore described with regard to the first embodiment as shown in FIGS. 2 and 3, and the pictorial view of the signals shown in FIG. 7. The signal output of detectors 45A and 45B will be different in phase, as hereinbefore described, depending on the direction of rotation of disc 22, either clockwise or counter-clockwise, indicating an increase or decrease in altitude.

In practice, it has been found that the disc can be constructed of sheet aluminum that must be flat within 0.25 mm tolerance. A thickness of 0.15 mm has been found acceptable. The outer diameter of the disc may conveniently be approximately 25 mm in diameter and have 10 slots 29 and 10 opaque portions 30. The space between arms 26 and 28 may be approximately 10 mm leaving a clearnace between the arms 26, 28 and disc 22 of some 5 mm, which will avoid the sticking problem associated with absolute encoders.

Figure 6:
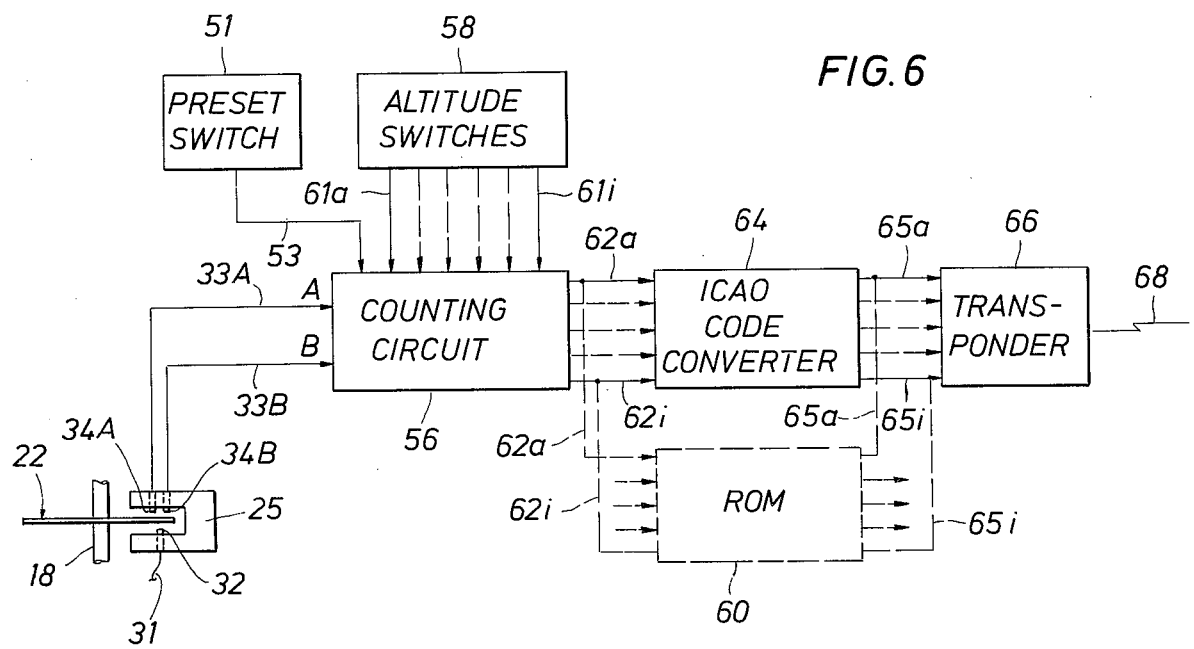
FIG. 6 is a block diagram showing the functional components of one embodiment of the encoding altimeter according to the present invention.

Referring now to FIGS. 1-3, and 6, the operation of the altitude encoder assembly will be described. As the barometric pressure assembly 15 drives the altimeter indicator shaft 18, as hereinabove described, disc 22 is rotated either in a clockwise or counter-clockwise direction and alternately passes an opaque portion 30, or a slot or transparent portion 29 between light source 32 and detectors 34A and 34B mounted on frame 25. The output of detectors 34A and 34B is applied through conductors 33A and 33B as inputs A and B, respectively, to counting circuit 56. The counter 56 can be preset to a predetermined digital count representative of a preselected function of altitude by means of manual switches 58 and 51. In actual practice, the pilot of the aircraft would set the altitude of the aircraft when on the ground or in the air into the counter 56 by means of manual switches 58 and 51. The manual switches preset counter 56 to a pre-determined digital count representative of the selected altitude function, which in the case of the configuration of FIG. 6, is pressure altitude plus 200 feet. Manual switches 58 are connected to counter 56 by means of conductors 61a-61i. Preset switch 51 applies a PRESET signal to counter 56 via conductor 53 to initially "set" the counter.

As the counter 56 receives the A and B signals from the detectors 34A and 34B, the preset count in the counter is incremented or decremented in response to changes in altitude in accordance with means hereinafter to be described in connection with FIG. 8. The output of the counter 56 is at least a nine bit digital code representative of altitude and applied via conductors 62a-62i to an ICAO code converter 64. The code converter 64 may be a hard wired gate circuit that receives the digital signals from counter 56 via signal paths 62a-62i and converts the digital signals to a parallel digital code (ICAO code) acceptable for transmission of aeronautical altitude information. The ICAO code bits are transmitted via signal paths 65a-65i from code converter 64 to transponder 66. Transponder 66 is a conventional aircraft transponder assembly which will convert code signals 65a-65i into radio frequency signals 68 for transmission.

ICAO code converter circuit 64 could, alternately, be replaced by a read only memory circuit (ROM) 60 (See FIG. 6) which would receive the digital signals representative of altitude from counting circuit 56 via signal paths 62a-62i. The ROM, programmed to effect the code conversion of the digital counter signals to the ICAO code would apply the converted ICAO code to transponder 66 through signal paths 65a-65i.

Figure 8:
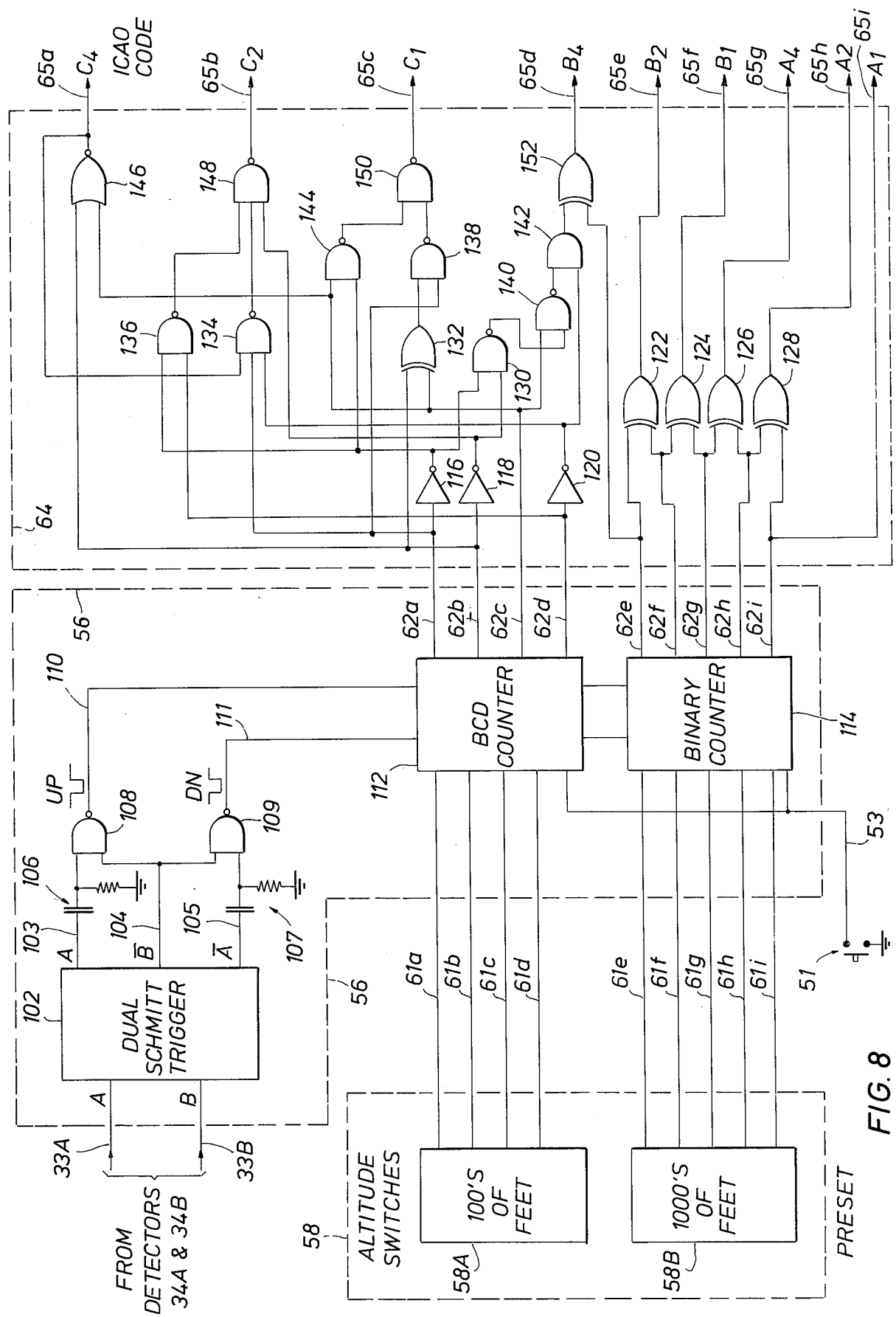
FIG. 8 is a detailed schematic view of the counting and code conversion means of the present invention.

Referring now to FIG. 8, a more detailed description of the circuitry of counting circuit 56 and the ICAO code converter 64 (See FIG. 6) will be discussed. Altitude switches 58 may comprise at least a pair of selector switches 58A and 58B, for selecting 100's and 1000's of feet respectively, and which when set apply predetermined pressure altitude digital signals to BCD counter 112 and binary counter 114 of counting circuit 56 by means of signal paths 61a-61i. The PRESET switch 51 applies a "preset" signal to counters 112 and 114 by means of signal path 53 to set the counters and enable them to receive the predetermined digital signals from altitude switches 58 which presets the counters to a digital count representative of the predetermined pressure altitude.

The A and B signals from detectors 34A and 34B, respectively, are applied as inputs to a dual Schmitt trigger circuit 102 of the counting circuit 56. The A output of the dual Schmitt trigger 102 is differentiated by the resistor-capacitor network 106 and applied via conductor 102 as one input to gate 108. The A output of the dual Schmitt trigger 102 is differentiated by the resistor-capacitor network 107 and applied via conductor 105 as one input to gate 109. The B output of the dual Schmitt trigger 102 is applied through conductor 104 as second inputs to gates 108 and 109. Gates 108 and 109 detect a change in either signal A or B and generate "up" and "down" signals applied through conductors 110 and 111 as inputs to BCD counter 112 for incrementing or decrementing the counter as the altitude changes.

The outputs of BCD and binary counters 112 and 114 are applied via signal paths 62a-62i to inverters 116, 118 and 120 and to the logic gate array forming the ICAO code converter circuit 64 comprising gates 122, 124, 126, 128, 130, 132, 134 136, 138, 140, 142, 144, 146, 148, 150 and 152 for generating the ICAO code bits $C_4$, $C_2$, $C_1$, $B_4$, $B_2$, $B_1$, $A_4$, $A_2$ and $A_1$ on signal paths 65a-65i, respectively.

Figure 9:
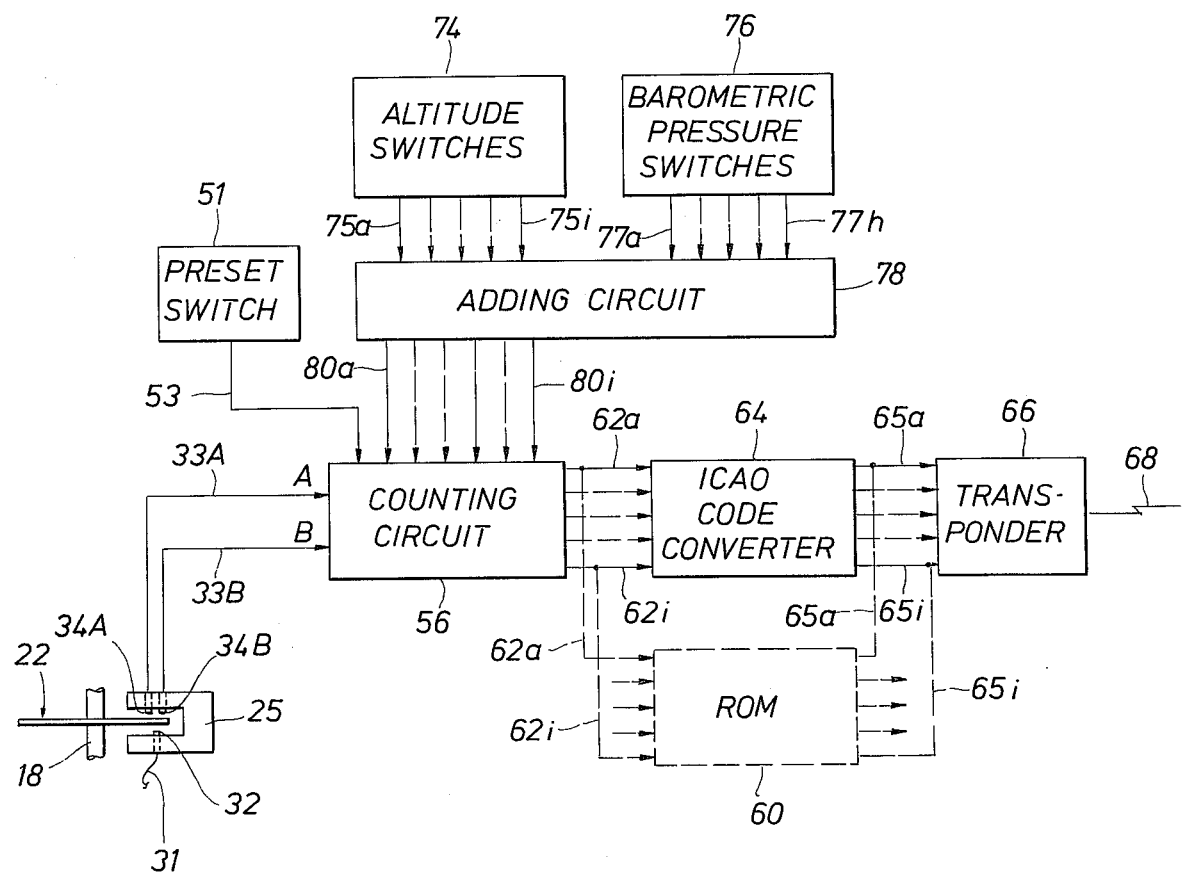
FIG. 9 is a block diagram showing the functional components of a second embodiment of the encoding altimeter according to the present invention.

Referring now to FIG. 9, another embodiment of the altitude encoder is shown. The means of generating signals A and B, preset switch 51, counting circuit 56, ICAO code converter 64 or, alternatively, ROM 60, and transponder 66 are all identical to the circuits identified by the identical reference numbers in the embodiment of FIG. 6, and need not be further described. However, the altitude switches 58 of the configuration of FIG. 6 has been replaced by altitude switches 74, barometric pressure switches 76 and adding circuit 78 which receives indicated altitude from switches 74 by means of signal paths 75a-75i and barometric pressure from switches 76 by means of signal paths 77a-77h. The summing or adding circuit 78 accomplishes the following equation:

$$PA = IA + (29.92 inHg - B) \times 1000 \text{ feet}$$

Where:
PA = pressure altitude
IA = indicated altitude
B = barometric pressure

The pressure altitude information from adding circuit 78 is a digital representation of pressure altitude applied through signal paths 80a-80i as an input to counting means 56 to preset the counter circuits (BCD and binary counters 112 and 114 as shown in FIG. 7) to the predetermined digital count representative of a predetermined pressure altitude.

Figure 10:
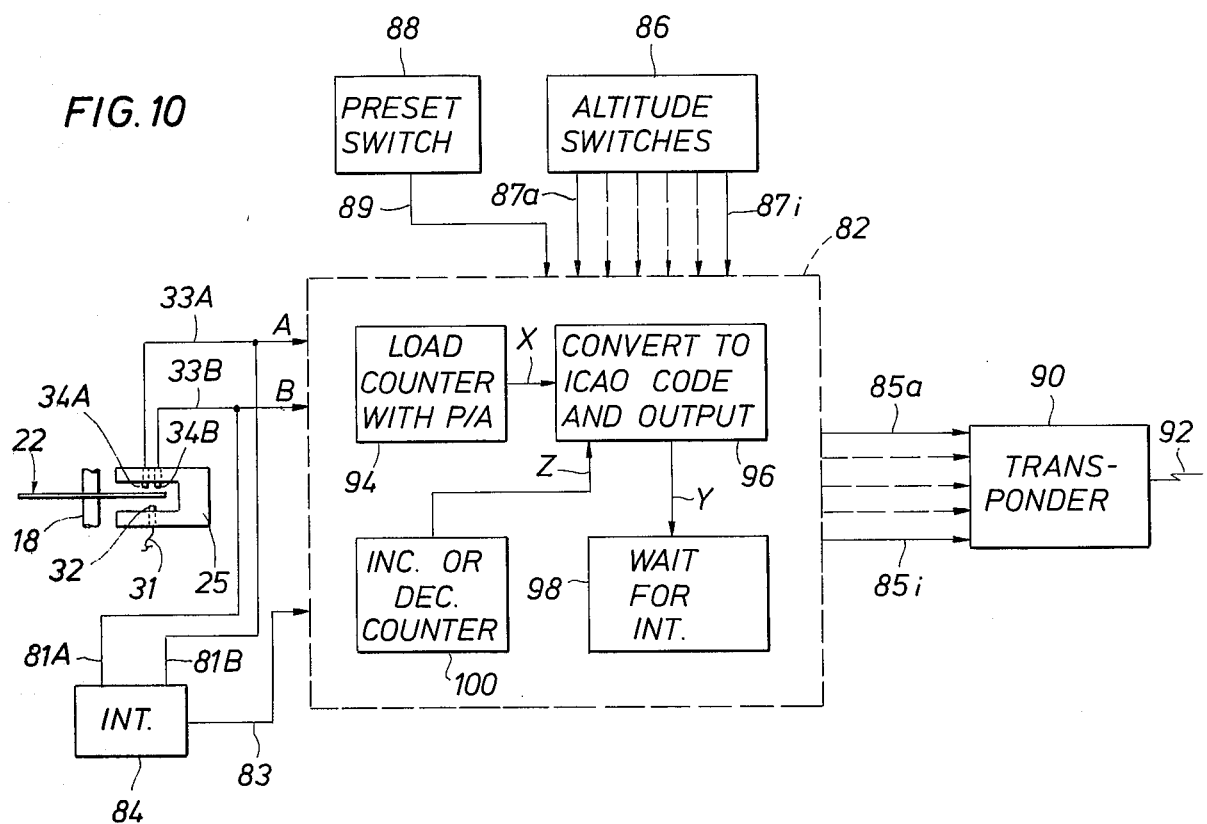
FIG. 10 is a block diagram showing the functional components of a third embodiment of the encoding altimeter according to the present invention.

FIG. 10 illustrates yet another embodiment of the altitude encoder utilizing a microprocessor or computer to accomplish the counting and code conversion processes. Signals A and B are generated by the signal generating means comprising disc 22, light source 32 and detectors 34A and 34B as hereinabove previously described. The signals A and B are applied through signal paths 33A and 33B, respectively, as inputs to microprocessor 82. Signals A and B are also applied to an interrupt circuit 84 through conductors 81A and 81B. The interrupt cirucit detects a change in either signal A or B and causes the microprocesser to examine input signals A and B and increment or decrement the internal counter as appropriate. A PRESET switch 88 is connected through conductor 89 to microprocessor 82 to perform an indentical "preset" function as earlier described with respect to PRESET switch 51. Altitude switches 86 comprise a plurality of switches that are preset in the same manner as pressure switches 58, hereinbefore described, and the output of which are applied to microprocessor 82 through paths 87a–87i. The microprocessor may be any processor or computer means programable to accomplish the counting and code conversion functions. The routines necessarily performed by the processor are:

1. Load counter with pressure altitude information from switches 86 upon receipt of "preset" signal from switch 88. (Routine 94)
2. Convert counter digital information representative of pressure altitude to ICAO code and output information. (Routine 96)
3. Wait for interrupt signal. (Routine 98)
4. Increment of decrement the counter in response to receipt of interrupt signal and condition of A and B. (Routine 100)

The ICAO code digital signals are applied from processor 82 through signal paths 85a–85i to a transponder 90 which converts code signals 85a–85i into radio frequency signals 92 for transmission.

Figure 11:
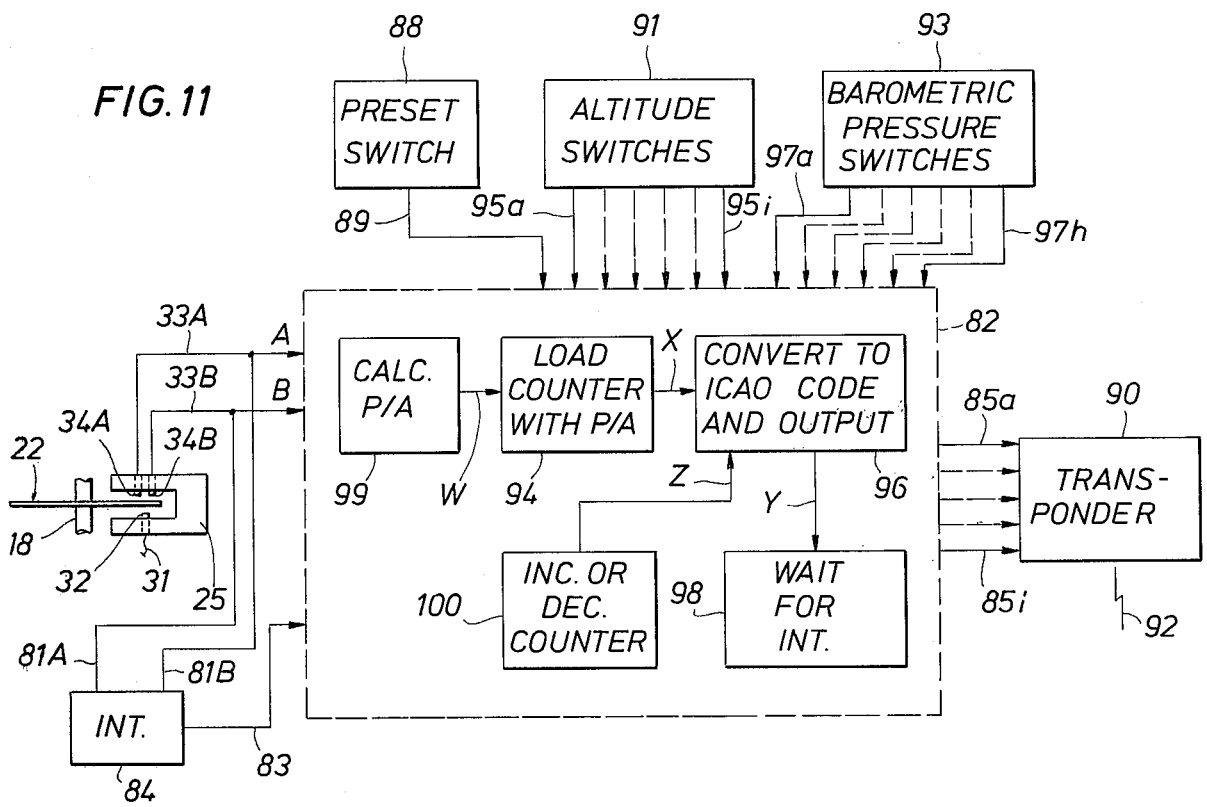
FIG. 11 is a block diagram showing the functional components of a fourth embodiment of the encoding altimeter according to the present invention.

FIG. 11 illustrates another embodiment which is a modification of the embodiment previously described with regard to FIG. 10. The means, circuitry and routines of FIG. 11 having the identical reference numbers as shown in FIG. 10 perform the identical functions as the means, circuitry and routines previously described with respect to the embodiment of FIG. 10 and need not be further discussed. However, altitude switches 86 of the embodiment of FIG. 10 have been replaced with altitude switches 91 and barometric pressure switches 92. Altitude switches 91 are identical to the pressure switches 74 hereinbefore described with respect to the embodiment described in connection with FIG. 9. The indicated altitude is preset on switches 91 and the digital information reflecting the indicated altitude is applied to processor 82 through signal paths 95a–95i. The current barometric pressure is preset on switches 93 and the digital signal levels representative of such barometric pressure is applied to processor 82 by means of signal paths 97a–97h. However, instead of utilizing a separate adding circuit as shown in FIG. 9, the processor of FIG. 11 performs a preliminary routine 99 tht calculates the pressure altitude according to the equation hereinabove explained prior to performing the routine 94 of loading the counter circuit with the pressure altitude. Once the preliminary pressure altitude routine is accomplished, then the embodiment of FIG. 11 performs in an identical manner to that hereinabove described with respect to the embodiment of FIG. 10.

Numerous variations and modifications may obviously be made in the structure herein described without departing from the present invention. Accordingly, it should be clearly understood that the forms of the invention herein described and shown in the figures of the accompanying drawings are illustrative only and are not intended to limit the scope of the invention.

What is claimed is:

1. An altitude encoder for providing a digital output representative of altitude, comprising
    an altimeter responsive to atmospheric pressure for rotating a shaft in correlation with the measured atmospheric pressure,
    first signal generating means cooperating with the shaft for producing first and second signals having a relative time of occurrence dependent on the direction of rotation of the shaft,
    switch means presettable to a predetermined position representative of a preselected function of altitude, and
    counting and code conversion means connected to the switch means for presetting the counting and code conversion means to a predetermined digital count representative of a preselected pressure altitude, the counting and code conversion means receiving the first and second signals and in response to the relative time of occurrence of the first and second signals increasing or decreasing the predetermined digital count preset in the counting and code conversion means in response to changes in altitude, and converting the digital count signals to a parallel digital code acceptable for transmission of aeronautical altitude information.

2. The altitude encoder described in claim 1, wherein the first signal generating means comprises
    a light source,
    a pair of laterally spaced light detectors spaced from the light source for receiving light therefrom, one of the detectors generating the first signals and the other of the detectors generating the second signals, and
    interrupting means cooperating with the light source and the pair of spaced light detectors to cause the relative time of occurrence of the first and second signals to change in accordance with the direction of rotation of the altimeter shaft.

3. The altitude encoder described in claim 2, wherein the interrupting means comprises a disc mounted on the shaft and rotatable therewith having repetitive, alternate, radially disposed opaque and transparent portions, the disc being disposed between the spaced light source and pair of light detectors for causing the repetitive opaque portions to mask one of the detectors before masking the other detector depending on the direction of rotation of the disc.

4. The altitude encoder described in claim 2, wherein the interrupting means comprises a disc mounted on the shaft and rotatable therewith having repetitive, alternate, radially disposed light absorbing and reflecting portions, the light source and pair of light detectors being spaced from the disc and located on the same side for causing the repetitive reflective portions to reflect light to one of the detectors before reflecting light to the other detector, depending on the direction of rotation of the disc.

5. The altitude encoder described in claim 1, wherein the counting and code conversion means comprises,
    a second signal generating means receiving the first and second signals and in respose to the relative time of occurrence of the first and second signals, generating a third signal representative of an increase in altitude and a fourth signal representative of a decrease in altitude,
    counting means presettable to a predetermined digital count representative of a preselected pressure altitude by said switch means, the counting means receiving the third and fourth signals and increasing or decreasing the predetermined count preset in the counting means in response to changes in altitude, the output of the counting means comprising a digital signal representative of altitude, and
    code conversion means receiving the digital signal from the counting means and converting the digital signal to a parallel digital code acceptable for transmission of aeronautical altitude information.

6. The altitude encoder described in claim 5, further including a transponder for receiving the converted parallel digital altitude code, and generating and transmitting a radio frequency signal representative thereof.

7. The altitude encoder described in claim 5, wherein the code conversion means comprises a read only memory programmed to perform the code conversion process.

8. The altitude encoder described in claim 1, wherein the counting and code conversion means comprises a microprocessor programmed to perform the following steps loading the counting circuit of the microprocessor with a predetermined pressure altitude determined by said switch means, converting the pressure altitude to a parallel digital code acceptable for transmission of aeronautical altitude information, and incrementing or decrementing the counting circuit in response to the generation of said first and second signals.

9. The altitude encoder described in claim 8, further including a transponder for receiving the converted parallel digital altitude code, and generating and transmitting a radio frequency signal representative thereof.

10. The altitude encoder described in claim 1, further including pressure switch means presettable to a predetermined position representative of a predetermined barometric pressure, and an adding circuit for receiving the output of the switch means and the pressure switch means for summing the functions of altitude and barometric pressure to produce a signal representative of pressure altitude for application to the counting and code conversion means.

11. The altitude encoder described in claim 8, further including pressure switch means presettable to a predetermined position representative of a predetermined barometric pressure, and wherein the microprocessor performs the preliminary step of calculating the pressure altitude by summing the functions of altitude and barometric pressure.

12. An altitude encoder for providing a digital output representative of altitude, comprising an altimeter responsive to atmospheric pressure for rotating a shaft in correlation with the measured atmospheric pressure, a light source, a pair of spaced light detectors spaced from the light source for receiving light therefrom, one of the detectors generating a first signal and the other of said detectors generating a second signal having a relative time of occurrence dependent on the direction of rotation of the shaft, a disc mounted on the shaft for rotation therewith and having repetitive, alternate, radially disposed opaque and transparent portions, the disc being disposed between the spaced light source and pair of light detectors for causing the repetitive opaque portions to mask one of the detectors before masking the other detector depending on the direction of rotation of the disc for producing the first and second signals, signal generating means receiving the first and second signals, signal generating means receiving the first and second signals and in response to the relative time of occurrence of the first and second signals generating a third signal representative of an increase in altitude and a fourth signal representative of a decrease in altitude, counting means presettable to a predetermined digital count representative of a preselected pressure altitude, the counting means receiving the third and fourth signals and increasing or decreasing the predetermined count preset in the counting means in response to changes in altitude, the output of the counting means comprising a digital signal representative of altitude, and code conversion means receiving the digital signal from the counting means and converting the digital signal to a parallel digital code acceptable for transmission of aeronautical altitude information.

13. The altitude encoder described in claim 12, wherein the counting means is presettable to a predetermined digital count by means of a plurality of selector switches interconnected to the counting means.

* * * * *